United States Patent [19]
Kubota et al.

[11] Patent Number: 6,059,891
[45] Date of Patent: May 9, 2000

[54] APPARATUS AND METHOD FOR WASHING SUBSTRATE

[75] Inventors: Minoru Kubota, Ozumachi; Kenichi Miyamoto, Kumamoto; Hideya Tanaka, Kumamoto; Ryoji Higuchi, Kumamoto, all of Japan

[73] Assignee: Tokyo Electron Limited, Japan

[21] Appl. No.: 09/120,551

[22] Filed: Jul. 22, 1998

[30] Foreign Application Priority Data

Jul. 23, 1997 [JP] Japan ................................. 9-197226

[51] Int. Cl.$^7$ ...................................................... B08B 7/04
[52] U.S. Cl. ............................ 134/18; 134/902; 134/1.3; 134/2; 134/6; 134/33; 134/113; 134/56 R; 15/77; 15/102
[58] Field of Search ................................. 134/113, 56 R, 134/902, 1.3, 2, 18, 32, 33, 34, 6, 57 R, 1, 7; 15/77, 102, 88.1, 88.2, 88.3

[56] References Cited

U.S. PATENT DOCUMENTS

| | | |
|---|---|---|
| 4,985,722 | 1/1991 | Ushjima et al. . |
| 5,061,144 | 10/1991 | Akimoto et al. . |
| 5,081,733 | 1/1992 | Kudo . |
| 5,092,011 | 3/1992 | Gommori et al. . |
| 5,144,711 | 9/1992 | Gill, Jr. . |
| 5,213,118 | 5/1993 | Kamikawa . |
| 5,226,437 | 7/1993 | Kamikawa . |
| 5,236,515 | 8/1993 | Ueno et al. . |
| 5,261,431 | 11/1993 | Ueno et al. . |
| 5,278,821 | 1/1994 | Kawamura et al. . |
| 5,282,289 | 2/1994 | Hasegawa et al. . |
| 5,297,910 | 3/1994 | Yoshioka et al. . |
| 5,327,921 | 7/1994 | Mokuo et al. . |
| 5,345,639 | 9/1994 | Tanoue et al. . |
| 5,370,142 | 12/1994 | Nishi et al. . |
| 5,498,294 | 3/1996 | Matsushita et al. . |
| 5,503,171 | 4/1996 | Yokomizo et al. . |
| 5,509,464 | 4/1996 | Turner et al. . |
| 5,520,744 | 5/1996 | Fujikawa et al. . |
| 5,626,675 | 5/1997 | Sakamoto et al. . |
| 5,636,401 | 6/1997 | Yonemizu . |
| 5,651,160 | 7/1997 | Yonemizu et al. . |
| 5,730,162 | 3/1998 | Shindo et al. . |
| 5,858,112 | 1/1999 | Yonemizu et al. ......................... 134/6 |
| 5,865,901 | 2/1999 | Yin et al. .................................... 134/2 |
| 5,882,426 | 3/1999 | Yonemizu et al. ......................... 134/6 |
| 5,964,954 | 10/1999 | Matsukawa ................................ 134/6 |

FOREIGN PATENT DOCUMENTS

| | | |
|---|---|---|
| 58-61632 | 4/1983 | Japan . |
| 58-66333 | 4/1983 | Japan . |
| 61-16528 | 1/1986 | Japan . |
| 61-48258 | 10/1986 | Japan . |
| 62-136825 | 6/1987 | Japan . |
| 62-47153 | 10/1987 | Japan . |
| 62-252147 | 11/1987 | Japan . |
| 64-57624 | 3/1989 | Japan . |
| 64-81230 | 3/1989 | Japan . |
| 1-120828 | 5/1989 | Japan . |
| 1-38721 | 5/1989 | Japan . |

(List continued on next page.)

*Primary Examiner*—Randy Gulakowski
*Assistant Examiner*—Alexander Markoff
*Attorney, Agent, or Firm*—Graham & James LLP

[57] ABSTRACT

An apparatus for washing a substrate comprises a spin chuck for holding and rotating a substrate, washing brush mechanism for supplying a washing liquid onto a surface of the substrate held on the spin chuck, and applying a physical force to contaminants present on a surface of the substrate so as to remove contaminants, a supporting arm for supporting the washing brush mechanism, an arm driving mechanism for driving the supporting arm to move the washing means along the surface from a central portion toward a peripheral portion of the substrate, and a control device for controlling the operation of at least one of the washing means, the spin chuck and the arm driving mechanism so as to control the physical force acting on the contaminants present on the surface of the substrate depending on the state of the contaminants.

24 Claims, 16 Drawing Sheets

FOREIGN PATENT DOCUMENTS

| | | |
|---|---|---|
| 1-184926 | 7/1989 | Japan . |
| 2-130827 | 5/1990 | Japan . |
| 3-52226 | 3/1991 | Japan . |
| 3-52228 | 3/1991 | Japan . |
| 3-116731 | 5/1991 | Japan . |
| 4-15920 | 1/1992 | Japan . |
| 4-56321 | 2/1992 | Japan . |
| 4-14494 | 3/1992 | Japan . |
| 4-130724 | 5/1992 | Japan . |
| 4-196531 | 7/1992 | Japan . |
| 4-304652 | 10/1992 | Japan . |
| 4-332129 | 11/1992 | Japan . |
| 5-36814 | 2/1993 | Japan . |
| 5-36815 | 2/1993 | Japan . |
| 5-121361 | 5/1993 | Japan . |
| 5-182946 | 7/1993 | Japan . |
| 5-53241 | 7/1993 | Japan . |
| 5-326476 | 12/1993 | Japan . |
| 6-204201 | 7/1994 | Japan . |
| 9-148295 | 6/1997 | Japan . |

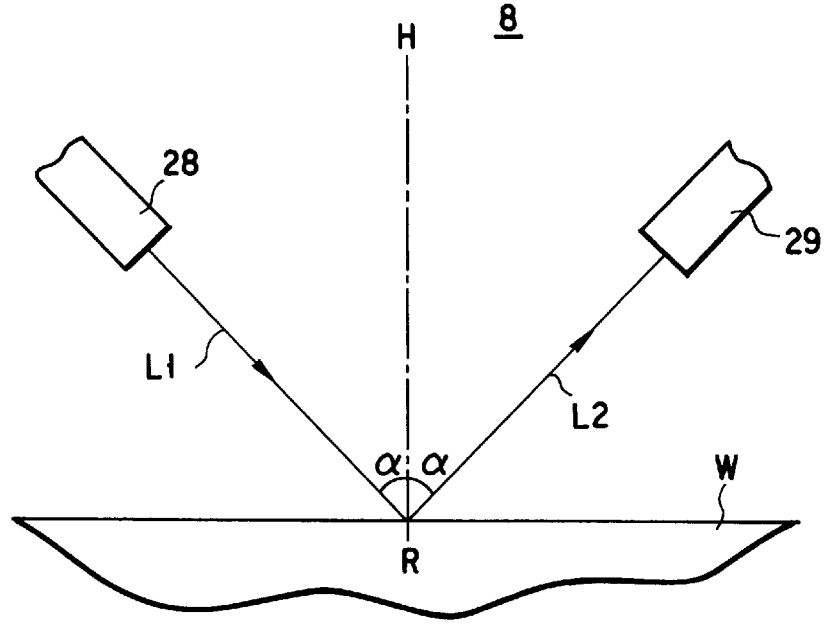
F I G. 11A
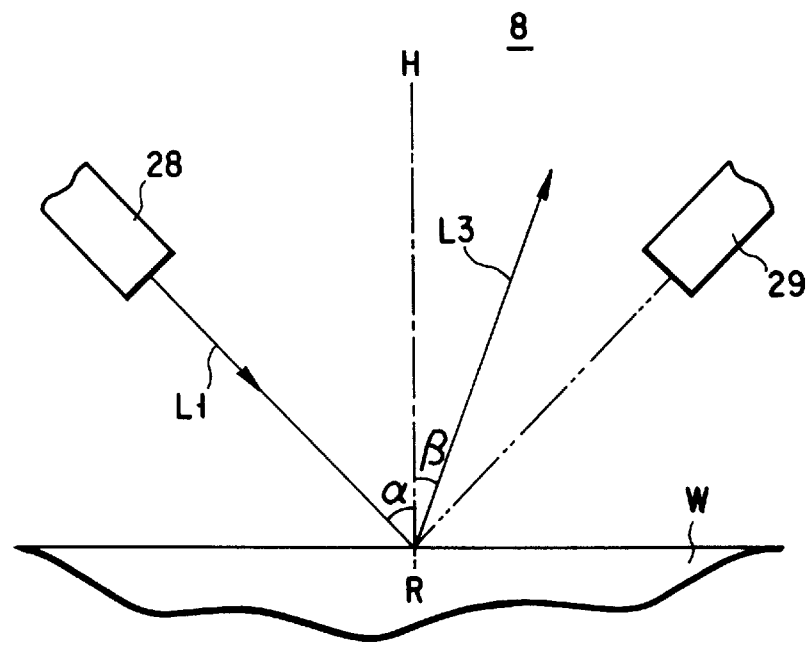
F I G. 11B

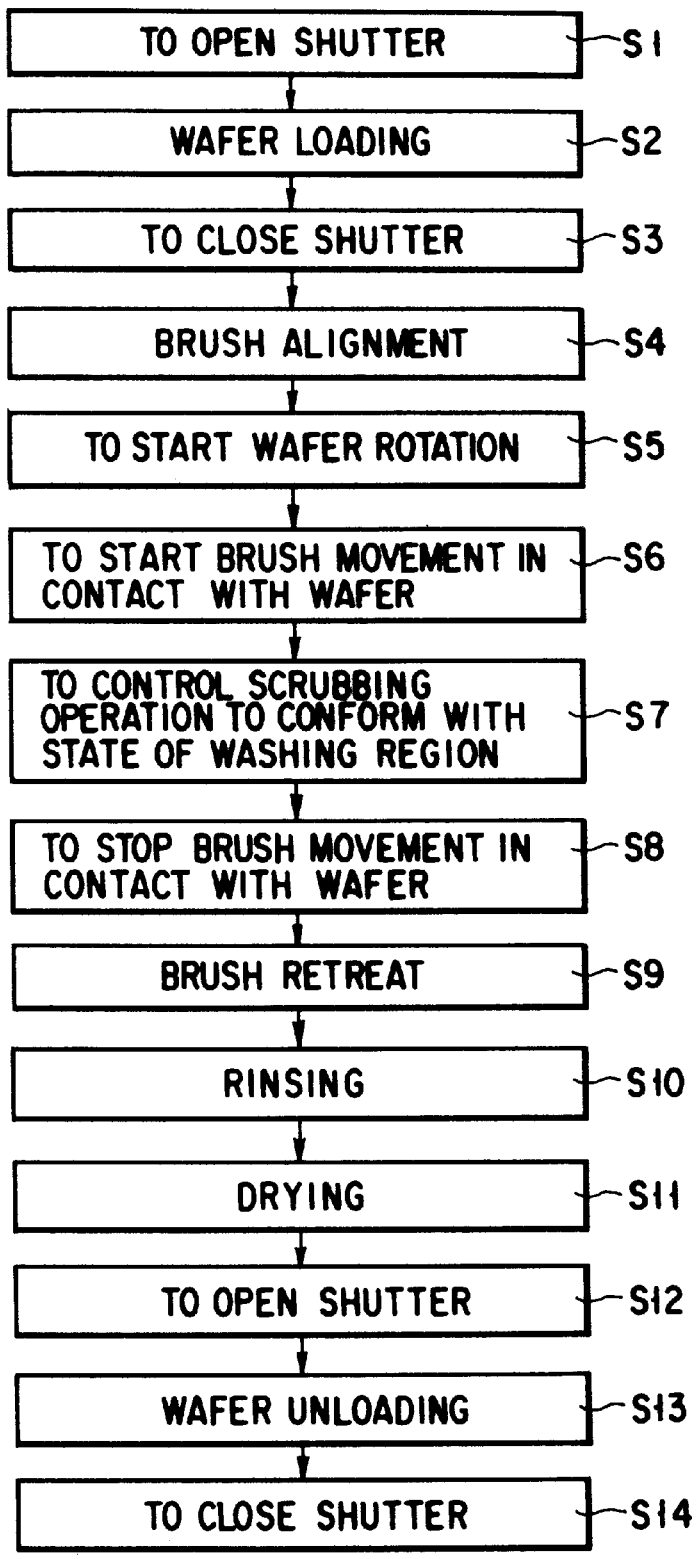
F I G. 12

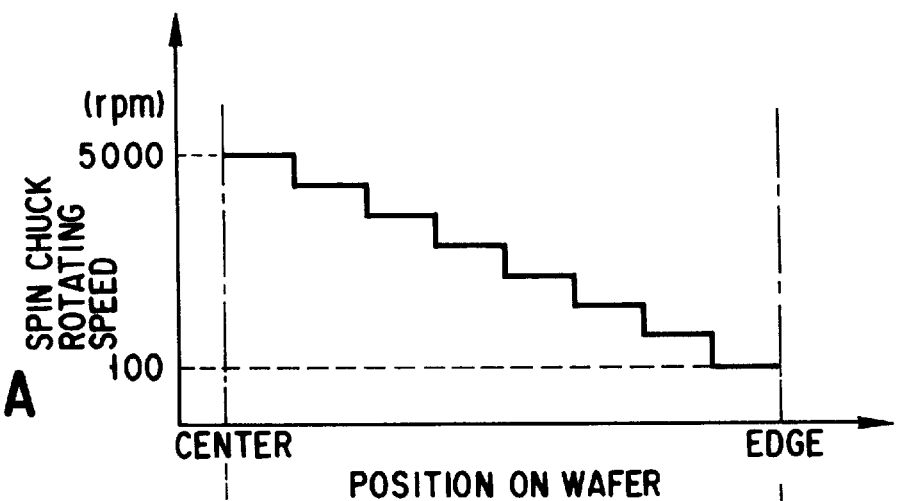
F I G. 19A
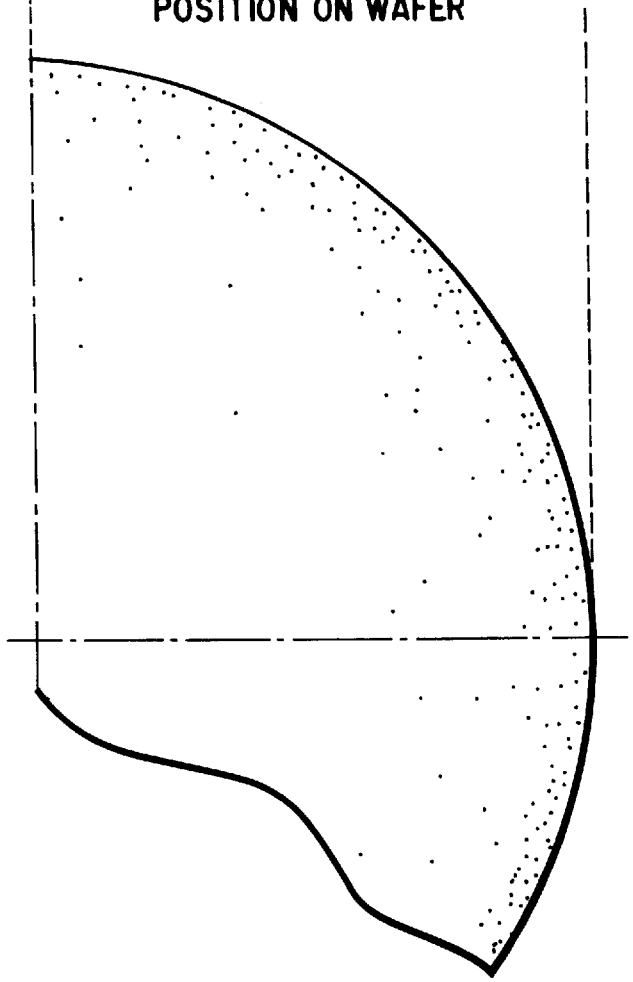
F I G. 19B

APPARATUS AND METHOD FOR WASHING SUBSTRATE

BACKGROUND OF THE INVENTION

The present invention relates to an apparatus and method for washing a substrate for cleansing a surface of a substrate such as a semiconductor wafer or an LCD substrate.

In the manufacturing process of a semiconductor device such as an LSI, a surface of a semiconductor wafer is strictly required to be maintained at a high cleanliness. To meet this requirement, a surface of a wafer is washed every time the wafer is subjected to any treatment or both before and after the treating process. In, particularly, the photolithography step, it is absolutely necessary to wash the surface of the wafer. The washing treatment of the wafer surface is carried out by a scrub-washing apparatus disclosed in, for example, Japanese Patent Disclosure (Kokai) No. 57-102024 or Japanese Patent Disclosure No. 62-259447. In the scrub-washing apparatus, a rotary brush is brought into contact with a wafer surface while applying a washing liquid to the wafer surface. Also, the rotary brush is moved at a predetermined speed along the wafer surface from a central portion toward a peripheral portion of the wafer so as to remove contaminants attached to the wafer surface.

However, the contaminants attached to the wafer surface are not necessarily distributed uniformly over the entire wafer surface. For example, these contaminants may be concentrated in a central portion or in a region of the peripheral portion of the wafer. Therefore, the contaminants tend to remain in the heavily contaminated portion even after the washing treatment. If the washing time is simply increased in an attempt to overcome this difficulty, the region of high cleanliness tends to be degraded in cleanliness. The decrease in cleanliness of the originally clean region is considered to be derived from the fact that the rotary brush itself generates contaminants.

BRIEF SUMMARY OF THE INVENTION

An object of the present invention is to provide an apparatus for washing a substrate, which permits washing the entire surface of a substrate uniformly at a high degree of cleanliness.

Another object is to provide a method of washing a substrate, which permits washing the substrate in a short time depending on the degree of contamination the substrate surface and which also permits increasing the through-put of the washing treatment.

According to an aspect of the present invention, there is provided an apparatus for washing a substrate, comprising:

a spin chuck for holding and rotating a substrate to be washed;

washing means for supplying a washing liquid onto a surface of the substrate held on the spin chuck, and applying a physical force to contaminants present on a surface of the substrate so as to remove the contaminants;

a supporting arm for supporting the washing means;

an arm driving mechanism for driving the supporting arm to move the washing means along the surface from a central portion toward a peripheral portion of the substrate; and control means for controlling the operation of at least one of the washing means, spin chuck and arm driving mechanism so as to control the physical force acting on the contaminants present on the surface of the substrate depending on the state of the contaminants.

The washing means used in the present invention is not limited to a brush for the scrub-washing. For example, it is also possible to use as the washing means an ultrasonic washer (i.e., a megasonic washing utilizing ultrasonic wave of several megahertz), in which an ultrasonic wave is applied to the washing liquid for washing the substrate surface, or a water jet washer in which a water jet is applied to the substrate surface for washing.

According to another aspect of the present invention, there is provided a method of washing a substrate, comprising the steps of:

(a) detecting a state of contaminants present on a surface of a substrate to be washed;

(b) holding the substrate by a spin chuck;

(c) aligning washing means mounted to an arm movably supported on an arm driving mechanism relative to the surface of the substrate held by the spin chuck;

(d) rotating the substrate together with the spin chuck; and (e) supplying a washing liquid onto the washing surface of the substrate, which is kept rotating and controlling the operation of at least one of the washing means, the spin chuck and the arm driving mechanism depending on the state of the contaminants detected in step (a), and applying a physical force to the contaminants present on the surface of the substrate so as to physically remove the contaminants.

Various contaminants such as particles, metal ions and organic substances are attached to and adsorbed on the surface of a semiconductor wafer so as to decrease the cleanliness of the wafer surface. These contaminants are not attached to or adsorbed on the entire surface of the semiconductor wafer uniformly and tend to be locally concentrated in a region of the wafer surface. In the present invention, the washing conditions are controlled depending on the local state of contaminants on the washing surface of the substrate. For example, where a large amount of contaminants is present in a central portion of the wafer surface, the moving speed of the brush (or ultrasonic washing nozzle) is lowered in the central portion of the wafer. Of course, where a large amount of contaminants is present in a peripheral portion of the wafer, the moving speed of the brush is lowered in the peripheral portion of the wafer. In other words, the brush is moved at a high speed in a clean portion where the amount of contaminants is small, with the result that the contaminants generated from the brush itself are not attached to the clean portion. It follows that the washing surface of the substrate can be washed uniformly to high level of cleanliness.

It is possible to control at least one of the brush contact pressure, brush rotating speed and spin chuck rotating speed while controlling the moving speed of the brush arm.

Additional objects and advantages of the invention will be set forth in the description which follows, and in part will be obvious from the description, or may be learned by practice of the invention. The objects and advantages of the invention may be realized from combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIGS. 11A and 11B schematically show the principle of detecting the surface state of a wafer;

FIG. 12 is a flow chart showing a method of washing a substrate according to another embodiment of the present invention;

FIG. 19A is a graph showing another example as to how to control the scrubbing operation in the method of the present invention for washing a substrate;

FIG. 19B shows distribution of contaminants present on a washing surface of wafer;

DETAILED DESCRIPTION OF THE INVENTION

Let us describe various preferred embodiments of the present invention with reference to the accompanying drawings.

Figure 1:
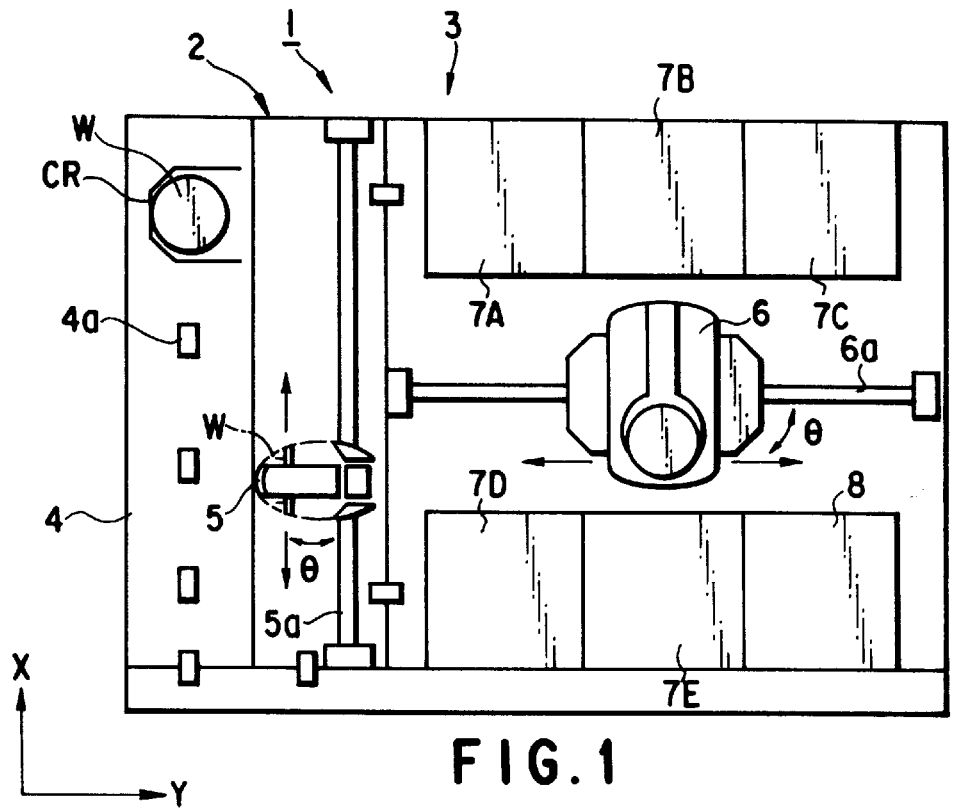
FIG. 1 is a plan view schematically showing a substrate washing system.
Figure 2:
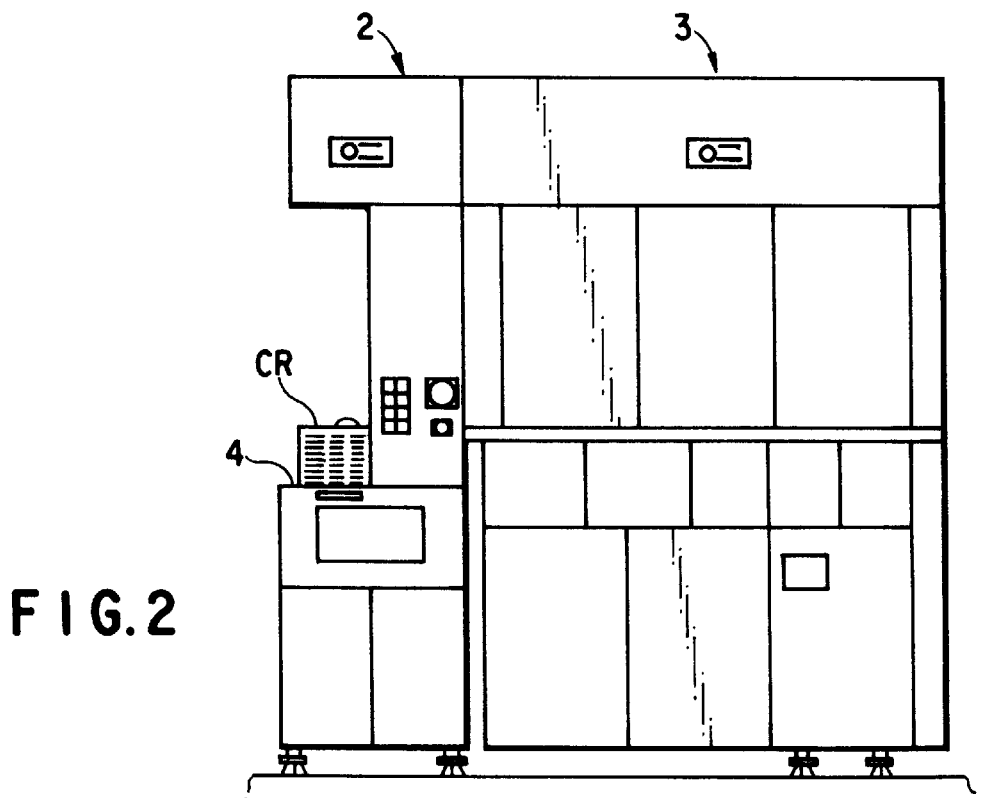
FIG. 2 is a front view schematically showing the substrate washing system shown in FIG. 1.
Figure 3:
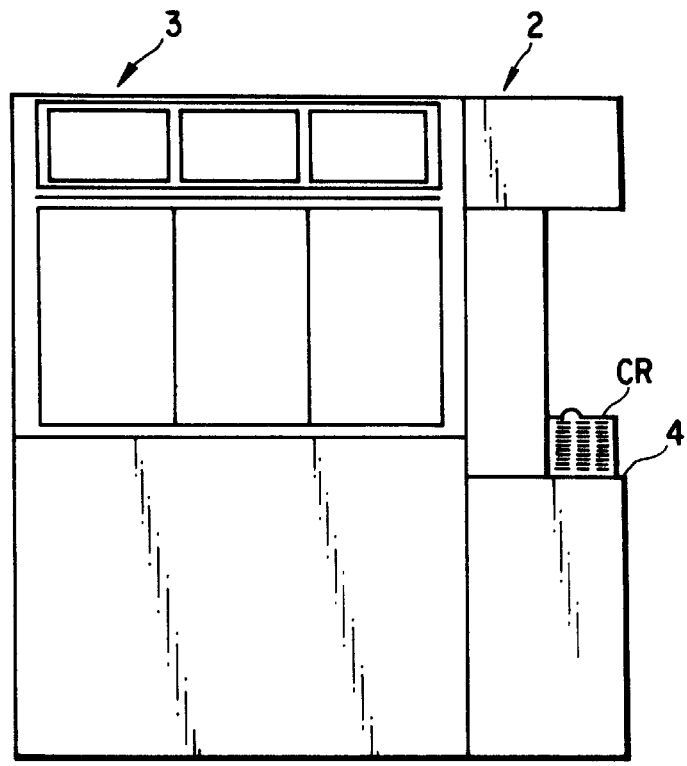
FIG. 3 is a back view schematically showing the substrate washing system shown in FIG. 1.

FIGS. 1 to 3 collectively show a wafer washing system 1. As shown in the drawings, the wafer washing system 1 comprises a cassette section 2 and a process section 3. Four projections 4a are mounted to a cassette table 4 in the cassette section 2. If a cassette CR is mounted on any of the projections 4a, the cassette CR is automatically arranged in a desired position. Housed in the cassette CR are, for example, 25 semiconductor wafers W sized at 8 inches in diameter.

A transfer path 5a is formed along the cassette table 4. A sub-arm mechanism 5 is moved along the transfer path 5a so as to obtain access to each of the cassettes CR. The sub-arm mechanism 5 comprises a wafer holder, a back-and-forth driving mechanism for moving the wafer holder back and forth, an X-axis driving mechanism for moving the wafer holder in the X-axis direction, a Z-axis driving mechanism for moving the wafer holder in the Z-axis direction, and a θ-swinging mechanism for swinging the wafer holder about the Z-axis.

The process section 3 comprises a main arm mechanism 6, five washing units 7A to 7E, and an inspecting unit 8. The main arm mechanism 6 comprises a back-and-forth driving mechanism for moving the wafer holder back and forth, a Y-axis driving mechanism for moving the wafer holder in the Y-axis direction, a Z-axis driving mechanism for moving the wafer holder in the Z-axis direction, and a θ-swinging mechanism for swinging the wafer holder about the Z-axis. Upon receipt of the wafer W from the sub-arm mechanism 5, the main arm mechanism 6 is moved along a central transfer path 6a so as to deliver the wafer W into each of the washing units 7A to 7E and the inspecting unit 8. The washing units 7A, 7B and 7C are arranged side by side on one side of the central transfer path 6a. Also, the two washing units 7D, 7E and the inspecting unit 8 are arranged side by side on the other side of the central transfer path 6a.

Each of the first and second washing units 7A and 7B is equipped with a megasonic washing mechanism in which an ultrasonic wave of several megahertz is applied to a washing liquid (pure water) while supplying the washing liquid to the wafer. The third washing unit 7C is equipped with a high pressure water jet mechanism in which a high pressure jet water is spurted against the wafer for washing the wafer surface.

The fourth washing unit 7D is equipped with a one surface scrub-washing mechanism in which an upper surface of the wafer is washed with a brush while supplying a washing liquid to the wafer W. Further, the fifth washing unit 7E is equipped with a both surface scrub-washing mechanism in which both upper and lower surfaces of the wafer W are washed with brushes while supplying a washing liquid to both surfaces of the wafer.

Figure 10:
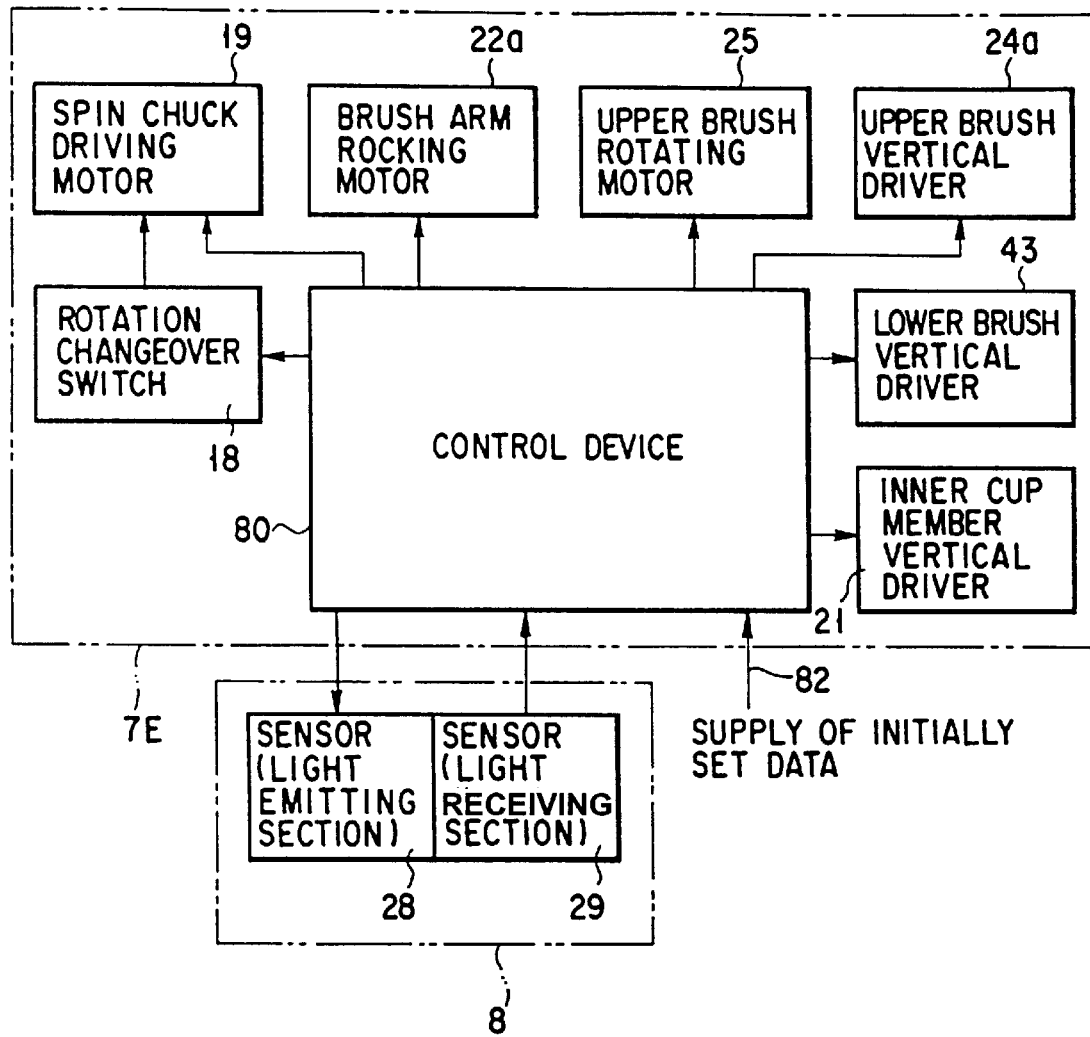
FIG. 10 is a block diagram showing the control system of the substrate washing apparatus shown in FIG. 4.

The inspecting unit 8 is equipped with a turntable (not shown) for holding and rotating the wafer W and with sensors 28, 29 (see FIG. 10). The surface of the wafer disposed on the turntable is irradiated with a laser light beam for allowing the sensors 28, 29 to detect contaminants present on the wafer surface. In this inspecting unit 8, a laser light emitted from the light emitting section 28 is applied to the surface of the wafer W which is kept rotating, and the reflected light is detected by the light receiving section 29. Also, a signal denoting the detection is supplied to a control device 80. Data showing the relationship between the amount of the detected laser light and the surface state of the wafer W (i.e., distribution and size of contaminants), which are measured in advance, are stored in a memory of the control device 80 as initially set data.

As shown in FIG. 11A, the light emitting section 28 and the light receiving section 29 are arranged within the inspecting unit 8 in symmetry with respect to a normal line RH. To be more specific, each of the emitted light L1 and the reflected light L2 forms an angle $\alpha$ with the normal line RH in the case where contaminants are not present in a measuring point R. Where contaminants are not present in the measuring point R, the laser light L1 emitted from the light emitting section 28 to form an angle $\alpha$ with the normal line RH is regularly reflected at the measuring point R, with the result that the reflected light L2 forming an angle $\alpha$ with the normal line RH is detected by the light receiving section 29. On the other hand, where contaminants are attached to the measuring point R on the wafer surface, the emitted light L1 is irregularly reflected at the measuring point R, with the result that the reflected light L3 forms an angle $\beta$ differing from the angle $\alpha$, as shown in FIG. 11B. In this case, the reflected light L3 fails to be detected by the light receiving section 29. In this fashion, the distribution of the contaminants is measured over the entire surface of the wafer W, and the result of the measurement is supplied to the control device 80.

Let us describe the fifth washing unit 7E as an example of the washing units with reference to FIGS. 4 to 10.

Figure 5:
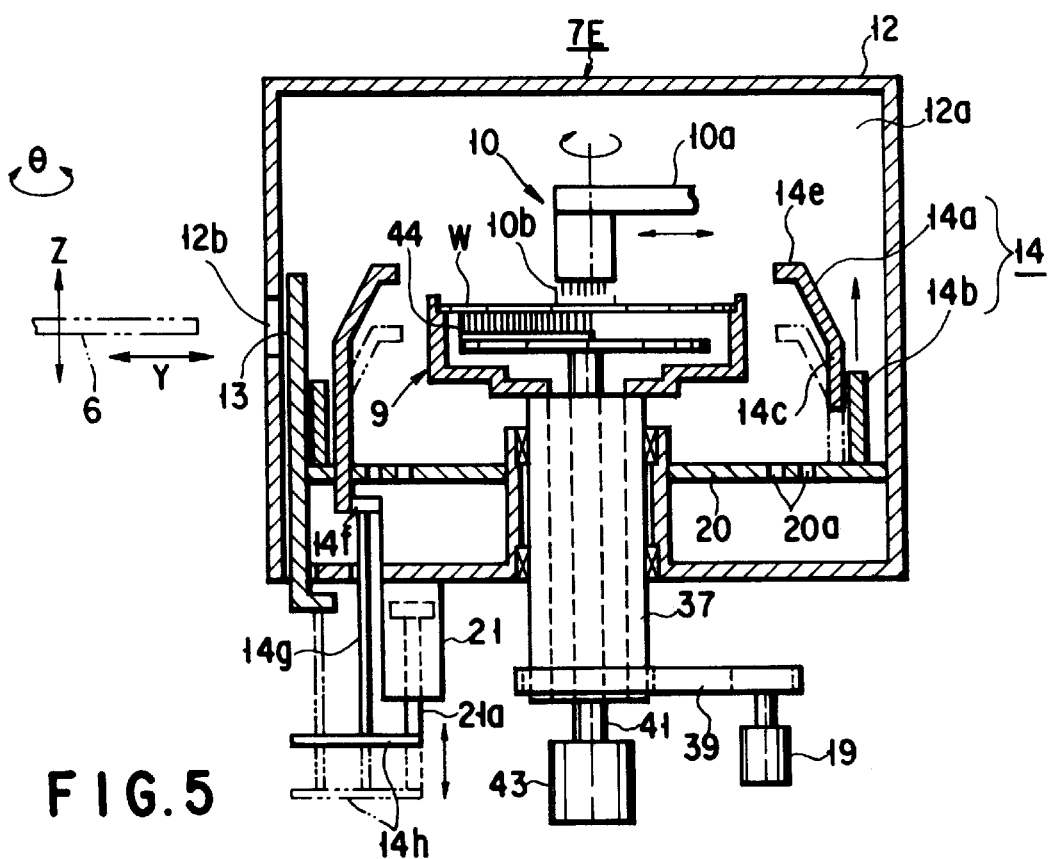
FIG. 5 is a cross sectional view schematically showing the substrate washing apparatus shown in FIG. 4.
Figure 4:
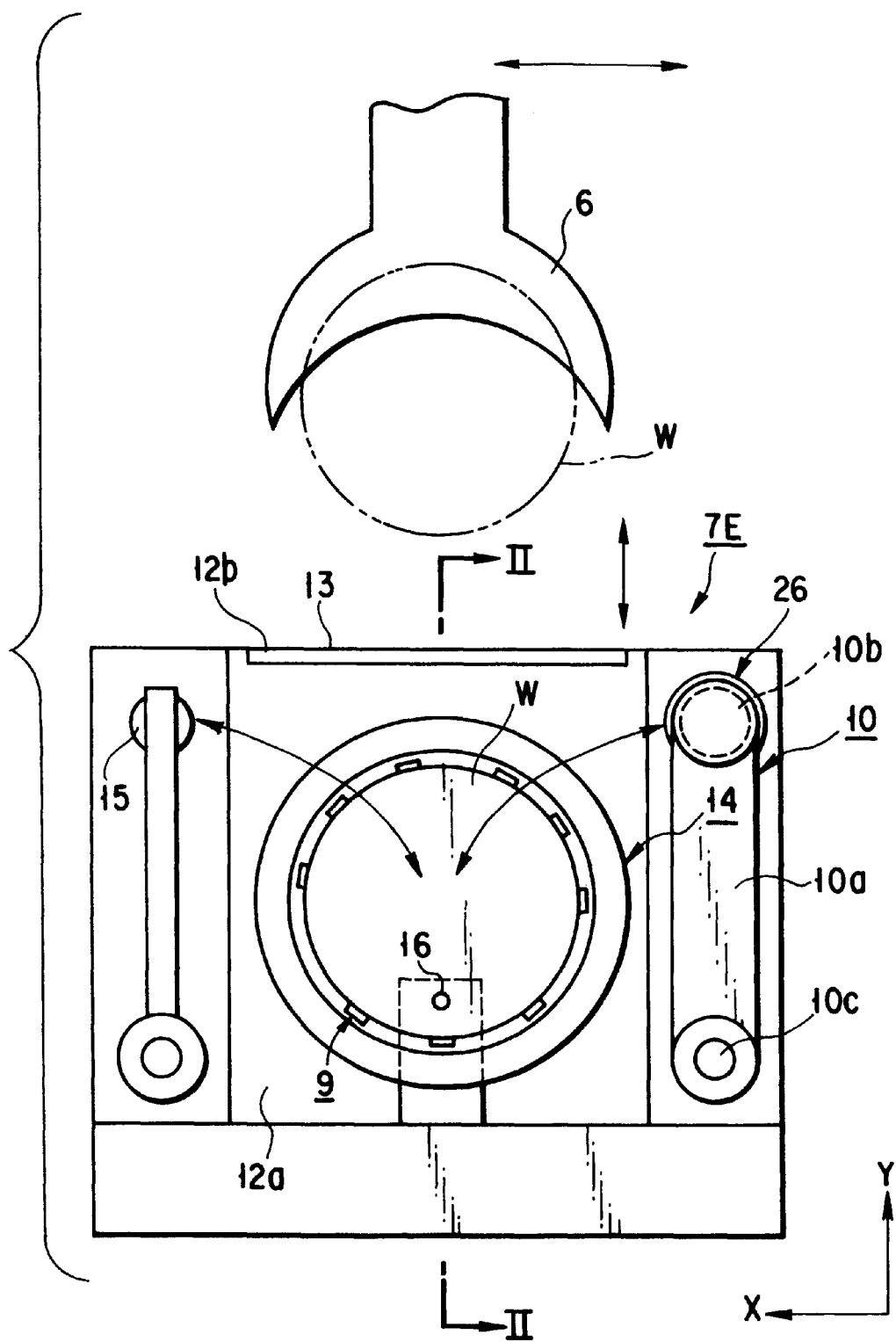
FIG. 4 is a plan view schematically showing a substrate washing apparatus according to one embodiment of the present invention.
Figure 6:
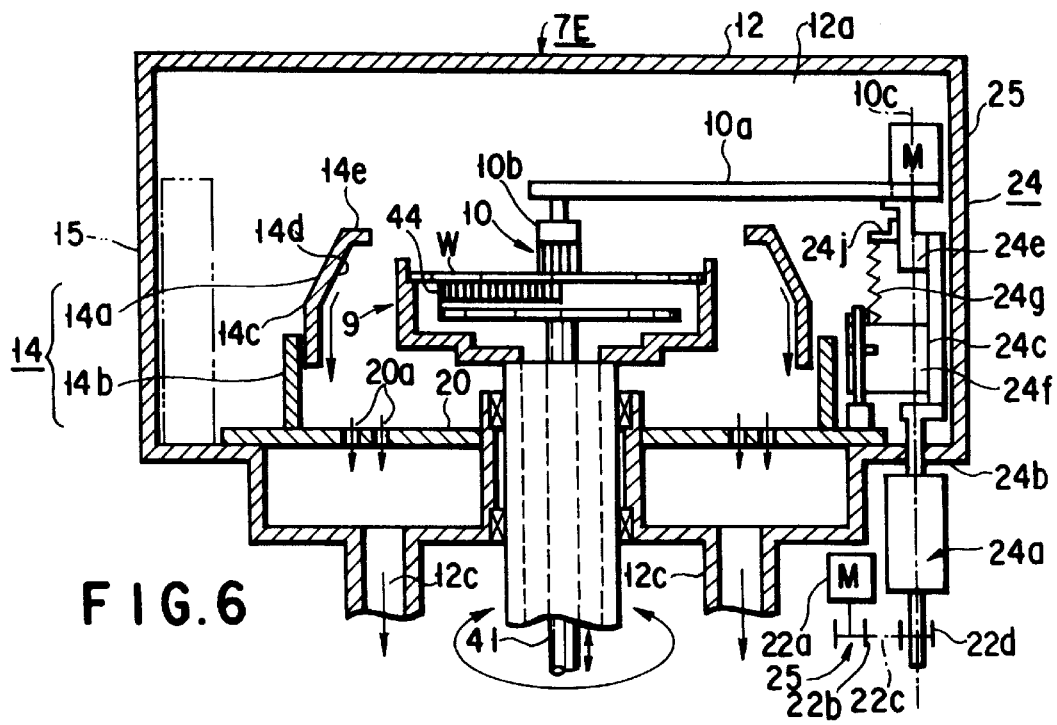
FIG. 6 is a cross sectional view schematically showing the substrate washing apparatus shown in FIG. 4.

As shown in FIGS. 4 to 6, the fifth washing unit 7E comprises a process chamber 12a for processing the semiconductor wafer W. The process chamber 12a is provided with an opening 12b through which the wafer W is transferred. The opening 12b is opened or closed by a shutter 13. The main arm mechanism 6 serves to load or unload the wafer W into and out of the process chamber 12a through the opening 12b.

Figure 8:
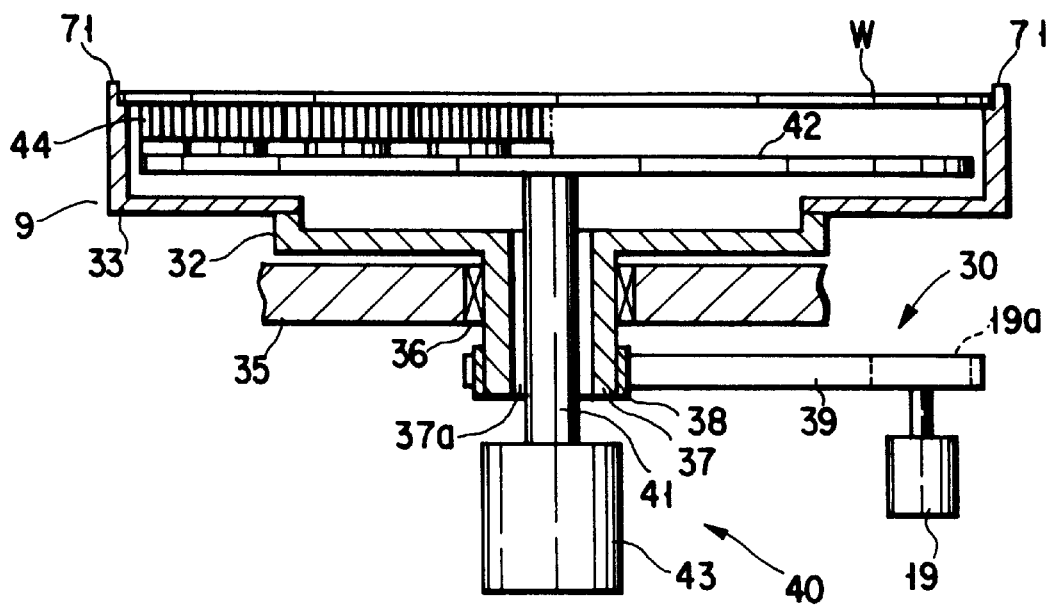
FIG. 8 is a cross sectional view showing a spin chuck driving mechanism and a brush mechanism for washing a back surface of a substrate, which are included in the apparatus shown in FIG. 4.
Figure 9:
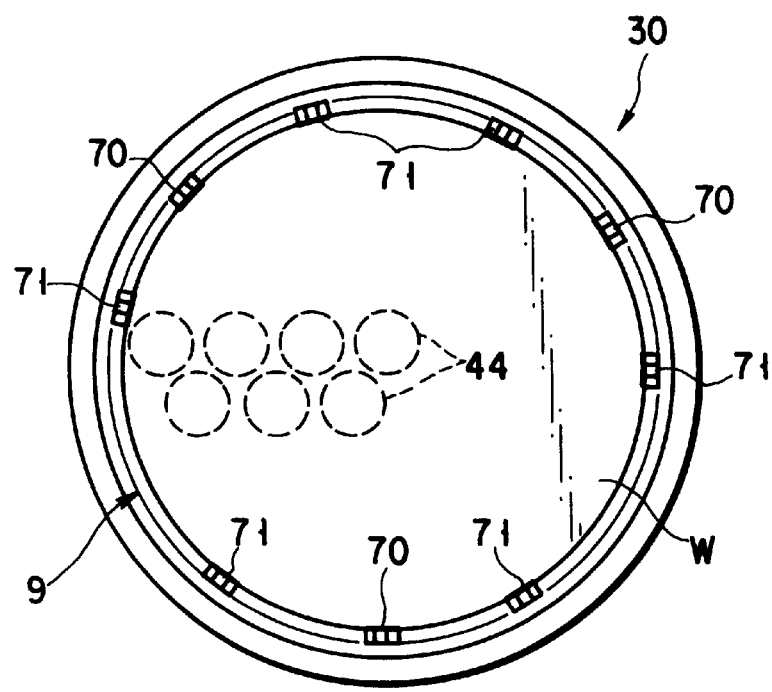
FIG. 9 is a plan view showing a wafer held on a spin chuck.

Arranged within the process chamber 12a are a spin chuck 9, an upper brush mechanism 10, a cup 14, a jet water spurting nozzle 15, a rinsing nozzle 16 and a lower brush mechanism 40. As shown in FIGS. 8 and 9, the spin chuck 9 is equipped with a rotary driving mechanism 30, a hollow shaft 37, a liquid receiving section 32 and a wafer holding section 33. The rotary driving mechanism 30 comprises a motor 19, a driving pulley 19a, a driven pulley 38 and a belt 39 which is stretch between the driving pulley 19a and the hollow shaft 38. The hollow shaft 38 is rotatably supported by a frame 35 via a bearing 36, and the upper end portion of the hollow shaft 38 is joined to the liquid receiving section 32. Further, a wafer holding section 33 is joined to the upper portion of the liquid receiving section 32. In other words, the wafer holding section 33 comprises three movable holding members 70 serving to press radially inward on the peripheral edge portion of the wafer W and six stationary holding members 71 defining the peripheral edge portion of the wafer W. The position of the wafer W is determined by these movable holding members 70 and stationary holding members 71 so as to prevent the wafer W from being detached from the wafer holding section 33 during rotation of the wafer W.

The upper brush mechanism 10, which is arranged in a free space above the spin chuck 9 within the process chamber 12a, comprises a rotary brush 10b which is brought into contact with the upper surface of the wafer W for scrubbing the wafer surface.

The jet water spurting nozzle 15 for spurting a jet water, which is arranged in an upper portion of the process chamber 12a and positioned on a side opposite to the upper brush mechanism 10, serves to spurt a high pressure jet water against the wafer W for washing the wafer W.

A plurality of rinsing nozzles 16 are arranged within the process chamber 12a. After the washing with the washing brush mechanism 10 or after the washing with the jet water, a rinsing liquid (pure water) is supplied from these rinsing nozzles 16 onto the wafer W so as to remove the residual contaminants and washing liquid from the wafer W.

The lower brush mechanism 40, which serves to wash the back surface of the wafer W, comprises an air cylinder 43, a rod 41, a collective brush 44 and a stage 42 supporting the collective brush 44, as shown in FIG. 8. The collective brush 44 is arranged within the wafer holding section 33 of the spin chuck 9 so as to face the back surface of the wafer W held by the spin chuck 9. As shown in FIG. 9, the collective brush 44 consists of a plurality of brushing units and is supported on the stage 42 in a manner to cover substantially a radius of the wafer W. The rod 41 extends through the hollow shaft 38 so as to be joined to a lower portion of the stage 42. If the rod 41 is projected upward from the cylinder 43, the collective brush 44 is allowed to abut against the back surface of the wafer W. Incidentally, each of the brushing units of the collective brush 44 may be supported rotatably or may be fixed immovably to the stage 42.

The cup 14, which is arranged to surround the periphery of the spin chuck 9, comprises a cylindrical outer cup member 14b standing from a bottom plate 20 fixed at the bottom portion of the process chamber 12a and a vertically movable inner cup member 12a arranged inside the outer cup member 12b. The inner cup member 12a comprises a cylindrical base portion 14c including an upwardly tapered upper region 14d. Also, an inward flange portion 14e is formed at the upper end of the tapered region 14d.

A vertically movable rod 14g is joined to the inner cup member 14a via a bracket 14f extending from the lower end of the cylindrical base portion 14c. The rod 14g is joined to a vertical piston rod 21a of a vertically movable cylinder 21 via a joining member 14h. The vertically movable cylinder 21 is arranged outside of the lower end of the process chamber 12a. It follows that the inner cup member 14a is moved up and down by the driving of the vertically movable cylinder 21. When moved to the uppermost position, the inner cup member 14a surrounds the outer circumferential edges of the spin chuck 9 and the wafer W. When the inner cup member 14a is moved to the lowermost position, the upper end of the inner cup member 14a is positioned lower than the spin chuck 9. The clearance formed between the bottom plate 20 and the lower end of the inner cup member 14a when the inner cup member 14a is moved to the uppermost position is closed by the outer cup member 14b. Therefore, the washing liquid supplied onto the wafer W is prevented from flowing to the outside of the cup 14.

The shutter 13 is joined to the joining member 14h to permit the shutter 13 to be opened or closed by the vertically movable cylinder 21. It follows that the vertical movement of the inner cup member 14a and the opening-closing of the shutter 13 are carried out in synchronism by the driving of the vertically movable cylinder 21.

A large number of small apertures (not shown) are formed in the ceiling of the process chamber 12a to permit clean air to be introduced into the process chamber 12a through these small apertures. On the other hand, a large number of air passageways 20a are formed concentrically through the bottom plate 20 in the vicinity of the inner wall of the inner cup member 14a. These air passageways 20a communicate with waste liquid and waste gas discharge means (not shown) through a drain passageway 12c formed through the bottom of the process chamber 12a. It follows that a down-flow of air is formed within the process chamber 12a.

Figure 7:
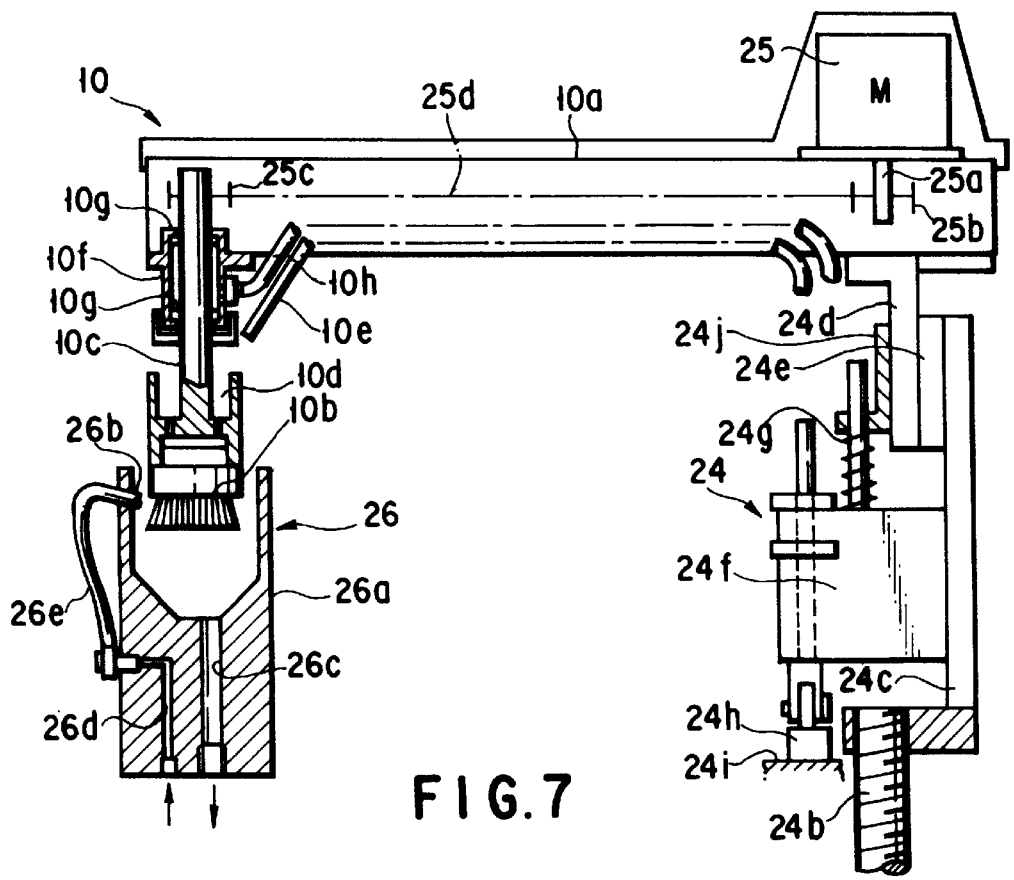
FIG. 7 is a cross sectional view showing a brush driving mechanism and a brush washing mechanism included in the apparatus shown in FIG. 4.

As shown in FIGS. 6 and 7, the upper brush mechanism 10 comprises a brush arm 10a as a horizontal moving means, which is joined to a brush arm swinging mechanism 22 and to an upper brush vertical driver 24a via a brush pushing force adjusting mechanism 24. A brush 10b is mounted to the free end of the brush arm 10a. Also, a motor 25 is mounted on the side of the proximal end of the brush arm 10a. A timing belt 25d is stretched between a driving pulley 25b joined to a driving shaft 25a of the motor 25 and a driven pulley 25c joined to a mounting shaft 10c of the brush 10b. The rotation of the motor 25 is transmitted by the timing belt 25d to the driven pulley 25c so as to rotate the brush 10b within a horizontal plane about its own vertical axis. In the case of washing the front face (pattern-forming surface) of the wafer W, it is possible not to rotate the brush 10b of the upper brush mechanism 10 about its own vertical axis in order to prevent the coated film on the pattern-forming surface of the wafer W from being damaged.

A brush washing section 26 is formed in the home position of the brush 10b so as to wash the brush 10b itself during non-use of the brush 10b. A washing liquid receiving section 10d is formed right above the brush 10b in a manner to surround the shaft 10c. A washing liquid (pure water) is supplied through a washing liquid supply pipe 10e into the washing liquid receiving section 10d. The pure water is supplied through a plurality of through-holes formed in the bottom portion of the washing liquid receiving section 10d onto the brush 10b and, then, onto the wafer W.

The mounting shaft 10c extends through a sleeve 10f vertically mounted below the free end of the brush arm 10a. A pair of bearings 10g are arranged within the sleeve 10f so as to rotatably support the mounting shaft 10c. The dust generated from the bearings 10g within the sleeve 10f is sucked by a tube 10h.

As shown in FIGS. 6 and 7, the brush pushing force adjusting mechanism 24 comprises a shaft 24b which is rotated by a swing driver 22a and vertically moved by a vertical driver 24a. A linear guide 24c is joined to the shaft 24b. The linear guide 24c can be swung and vertically moved in accordance with movement of the shaft 24b. A connector 24d is mounted below the proximal end of the brush arm 10a and engaged with the linear guide 24c via slider 24e. Also, an upper bracket 24j is joined to the connector 24d. Further, compression coil spring 24g is interposed between the upper bracket 24j and the lower bracket 24f.

The weight of the washing brush mechanism 10 whose vertical movement is guided by the linear guide 24c, i.e., the total weight of the brush arm 10a, the brush 10b, etc., is applied to the compression coil spring 24g. The pressurizing force applied to the wafer W is controlled by controlling the amount of the downward movement of the slider 24e caused by the vertical driver 24a. In other words, the height of the lowermost point of the brush 10b is adjusted in the case where the brush 10b does not abut against the wafer W and both the slider 24e and the brush arm 10a are downwardly moved together.

For example, where the brush 10b does not abut against the wafer W, the amount of the downward movement of the slider 24e is assumed to be determined to permit the lower surface of the brush arm 10a to be positioned lower by H mm than the upper surface of the wafer W. If the brush 10b abuts against the wafer W under this condition, the brush 10b is not moved downward to a position lower than the wafer W.

Therefore, the spring 24g is elongated by H mm, and an urging force corresponding to the elongation is applied to the brush 10b. The brush pushing force F applied by the brush 10b to the wafer W is proportional to the elongation of the spring 24g. It follows that equation (1) given below is established, where the spring constant is denoted by "k":

$$F = k \times H \tag{1}$$

If the brush 10b is brought into contact with the wafer W, the brush 10b itself also acts as a spring. It follows that the brush pushing force F can be adjusted within a somewhat allowable range. Since the brush pushing force adjusting mechanism 24 utilizing the spring characteristics of the spring 24b is employed in the present invention, the construction of the apparatus can be simplified, compared with prior art. In addition, the brush pushing force F can be adjusted easily.

A stopper bearing 24h is mounted below the bracket 24f. The maximum amount of the downward movement of the slider 24e, i.e., the lowermost point of the brush arm 10a, is determined by the stopper bearing 24h. A shaft supporting the stopper bearing 24h is mounted to the bracket 24f by a screw means such that the bracket 24f is vertically movable within a predetermined range. The stopper bearing 24h slides along an arcuate guide plane 24i formed about the center of swinging of the brush arm 10a, with the result that the brush arm 10a is swung under the condition that the brush 10b is in contact with the wafer W. In other words, the brush arm 10a is reversibly swung by the swinging driver 22 in a horizontal plane.

As shown in FIG. 6, the arm swinging mechanism 22 comprises a motor 22a. A timing belt 22d is stretched between a driving pulley 22b joined to the driving shaft of the motor 22a and a driven pulley 22c. Also, a ball screw mechanism is utilized in the vertical driver 24a.

As shown in FIG. 7, a brush washing section 26 for washing the brush 10b itself is formed in the waiting position of the upper brush mechanism 10. The brush washing section 26 comprises a washing vessel 26a housing the brush 10b. A nozzle 26b is arranged to project into an upper open portion of the washing vessel 26a such that a pure water is spurted from an upper position toward the base portion of the brush 10b. A waste liquid passageway 26c is formed in the bottom portion of the washing vessel 26a. Also, an L-shaped washing liquid supply passageway 26d, which is open in the lower end and a side end, is formed in a lower portion of the washing vessel 26a. A washing liquid supply pipe (not shown) is connected to the lower end of the washing liquid supply passageway 26d. On the other hand, a tube 26e for supplying a washing liquid into the washing vessel 26a is connected to the side end of the washing liquid supply passageway 26d.

Where the brush 10b is washed in the brush washing section 26, the brush 10b is moved to the waiting position so as to be housed in the washing vessel 26a. Then, the brush 10b is rotated. Under this condition, a washing liquid is spurted from the nozzle 26b toward the base portion of the washing brush mechanism 10 so as to wash away the dust, etc. attached to the brush 10b. The dust, etc. thus removed are discharged to the outside through the waste liquid passageway 26c and, thus, are prevented from being reattached to the brush 10b.

The control system of the fifth washing unit 7E is shown in FIG. 10. As shown in the drawing, each of the driving sources of the fifth washing unit 7E is controlled by a control device 80. The output section of the control device 80 is connected to the power source of each of the spin chuck driving motor 19, a rotation changeover switch 18, the upper brush arm swinging motor 22a, the upper brush swinging motor 25, an upper brush vertical driver 24a, a lower brush vertical driver 43, and an inner cup member vertical driving cylinder 21. The rotation changeover switch 18 serves to change the rotation of the spin chuck driving motor 19 from the clockwise direction to the counter clockwise direction. The control device 80 controls the rotation changeover switch 18 to permit the rotating direction of the spin chuck 9 to be changed every predetermined period of time.

The distribution of contaminants present on the washing surface of the wafer W before the washing treatment is stored in a memory of the control device 80 as initial data. For example, the data for controlling the moving speed (swinging speed) of the brush arm 10a is stored as the initial data. The distribution of contaminants noted above corresponds to the actual data obtained through experiences from the actual manufacturing process. The initial data is read out of the memory in the control device 80 so as to control the operation of each of the driving sources 18, 19, 22a, 25, 24a, 43 and 21.

Alternatively, the state of contaminants present on the washing surface of the wafer W is detected by using the optical sensors 28, 29 shown in FIGS. 11A and 11B, and the detected data is supplied to the control device 80 so as to control the operation of each of the driving sources 18, 19, 22a, 25, 24a, 43 and 21.

FIG. 12 is a flow chart showing the operation of the wafer washing apparatus described above.

In the first step, the cassette CR housing a predetermined number of wafers W is set on the cassette table 4 in the cassette section 2. If the wafer washing apparatus 1 is started up by depressing a start-up button under this condition, the shutter 13 is opened by the cylinder 21 (step S1). In this step, the inner cup member 14b is moved downward together with the shutter 13. On the other hand, the wafer W is taken out of the cassette CR by the sub-arm mechanism 5 so as to be delivered to the main arm mechanism 6. Then, the wafer W is loaded in the process chamber 12a through the opening 12b (step S2). Further, the wafer W is transferred from the holder of the main arm mechanism 6 onto the spin chuck 9, followed by retreating the holder of the main arm mechanism 6 from within the process chamber 12a and subsequently closing the shutter 13 (step S3).

In the next step, the upper and lower brushes 10b and 44 are moved so as to be aligned with the wafer W held on the spin chuck 9 (step S4). Under this condition, the wafer W is rotated together with the spin chuck 9 (step S5) and the upper and lower brushes 10b, 44 are brought into contact with the wafer W while supplying a washing liquid (pure water) onto both surfaces of the wafer W. In this step, the stroke of the downward movement of the upper brush 10b is controlled by the vertical driver mechanism 24 so as to control the pushing force of the upper brush 10b against the wafer W. Also, the upper brush 10b is rotated.

In the next step, the motor 22a is started so as to swing the arm 10a and move the upper brush 10b relative to the rotating wafer W (step S5). For example, the upper brush 10b is moved in a radial direction of the wafer W from a central portion toward a peripheral portion of the wafer W. During the movement of the upper brush 10b, the scrubbing operation of the upper brush 10b is controlled in accordance with the contaminated state of the washing region of the wafer W (step S7). In this step S7, the initial data is read out of the memory of the control device 80 so as to control the scrubbing operation based on the data read out of the control device 80. As described previously, the data used in this step may be either the initial data (data inputted by input means 82) on the relationship between the surface state of the wafer W and the scrubbing operation, said data being stored in advance in the memory of the control device 80, or the data on the surface state of the wafer W, which was detected in advance by the inspection unit 8. In step S7, the scrubbing operation of the brush is controlled in accordance with the contaminated state of the washing region of the wafer W so as to remove efficiently the contaminants from the surface of the wafer W.

Incidentally, it is possible for the upper brush 10b to be freely rotatable. Also, the upper brush 10b may be allowed to contact the washing liquid alone without bringing the upper brush 10b into direct contact with the upper surface of the substrate.

After the scrubbing operation, the movement of the upper brush 10b relative to the wafer W is stopped (step S8). Then, the upper brush 10b is moved into the waiting section 26, and the lower brush 44 is retreated downward (step S9). After the brush-washing treatment, the jet water spurting nozzle 15 is moved to a region above the wafer W, as required, so as to spurt a jet water onto the wafer W for washing the wafer W with the jet water.

Then, pure water is applied to both surfaces of the wafer W for the rinsing purpose (step S10). Then, the spin chuck 9 is rotated at a high speed for centrifugally removing the applied water from the wafer W (step S11), followed by opening the shutter 13 (step S12 and subsequently unloading the washed wafer W from within the process chamber 20a by the main arm mechanism 6 (step S13). Finally, the shutter 13 is closed (step S14).

Figure 13A:
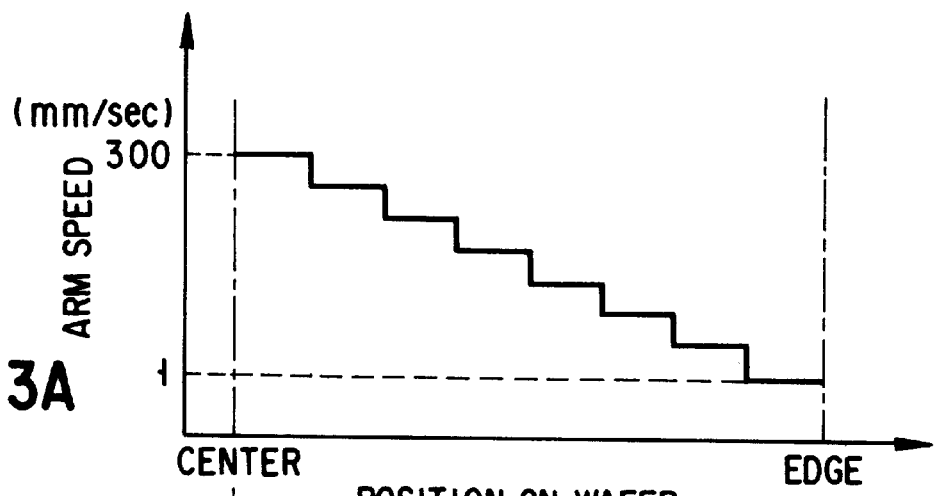
FIG. 13A is a graph showing an example as to how to control the scrubbing operation in the method of the present invention for washing a substrate.
Figure 13B:
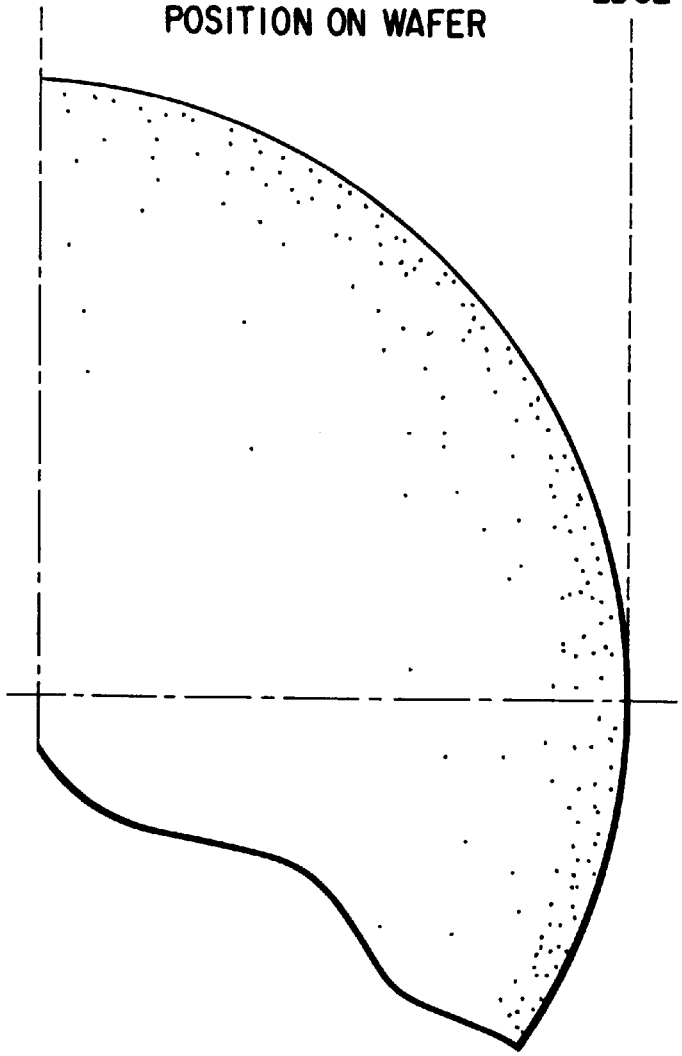
FIG. 13B shows distribution of contaminants present on a washing surface of wafer.
Figure 14A:
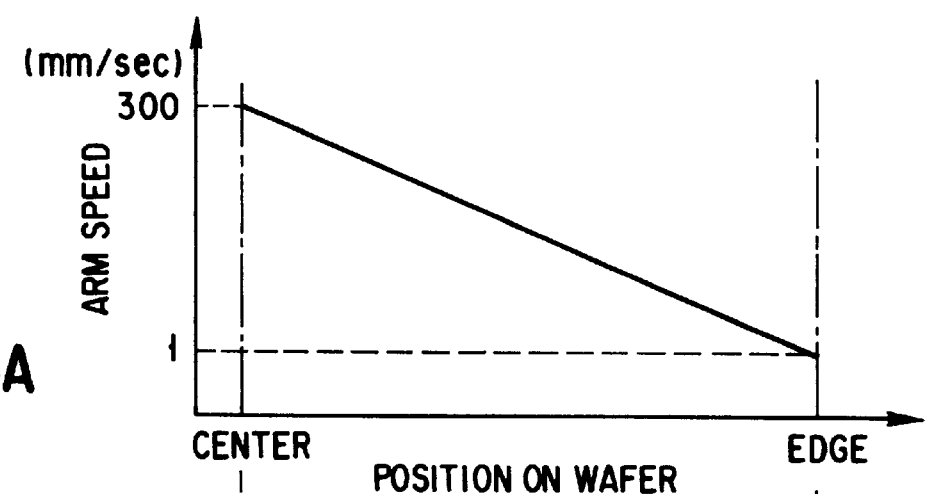
FIG. 14A is a graph showing another example as to how to control the scrubbing operation in the method of the present invention for washing a substrate.
Figure 14B:
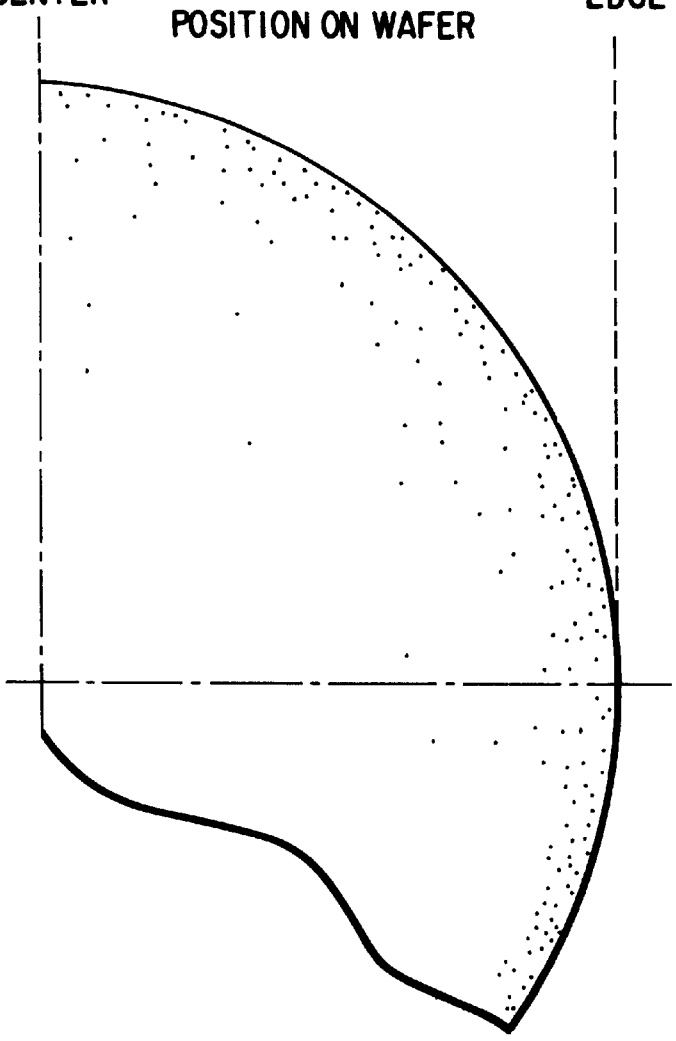
FIG. 14B shows distribution of contaminants present on a washing surface of wafer.
Figure 15A:
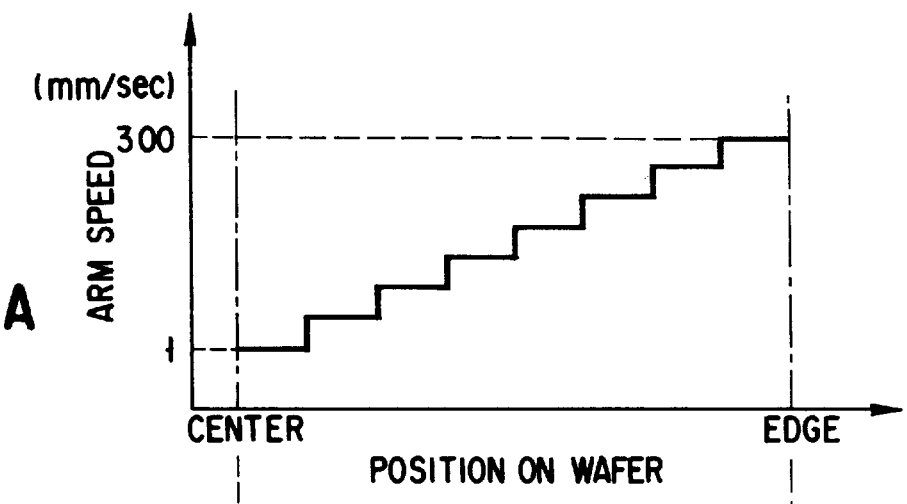
FIG. 15A is a graph showing another example as to how to control the scrubbing operation in the method of the present invention for washing a substrate.
Figure 15B:
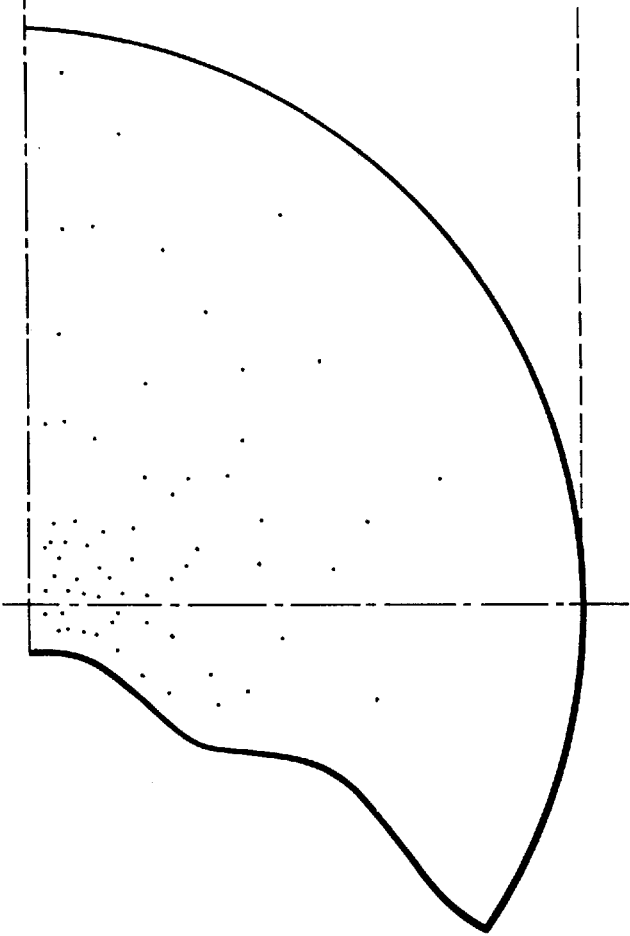
FIG. 15B shows distribution of contaminants present on a washing surface of wafer.
Figure 16A:
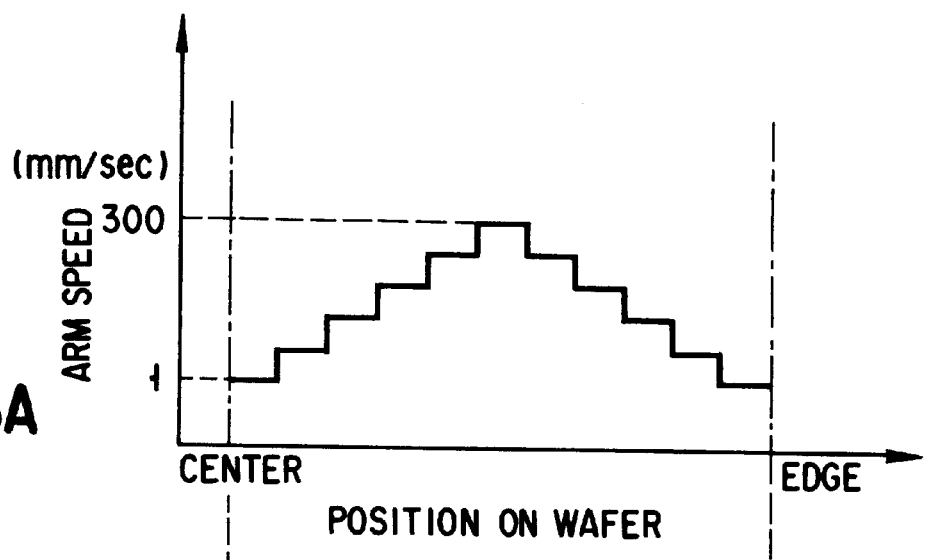
FIG. 16A is a graph showing another example as to how to control the scrubbing operation in the method of the present invention for washing a substrate.
Figure 16B:
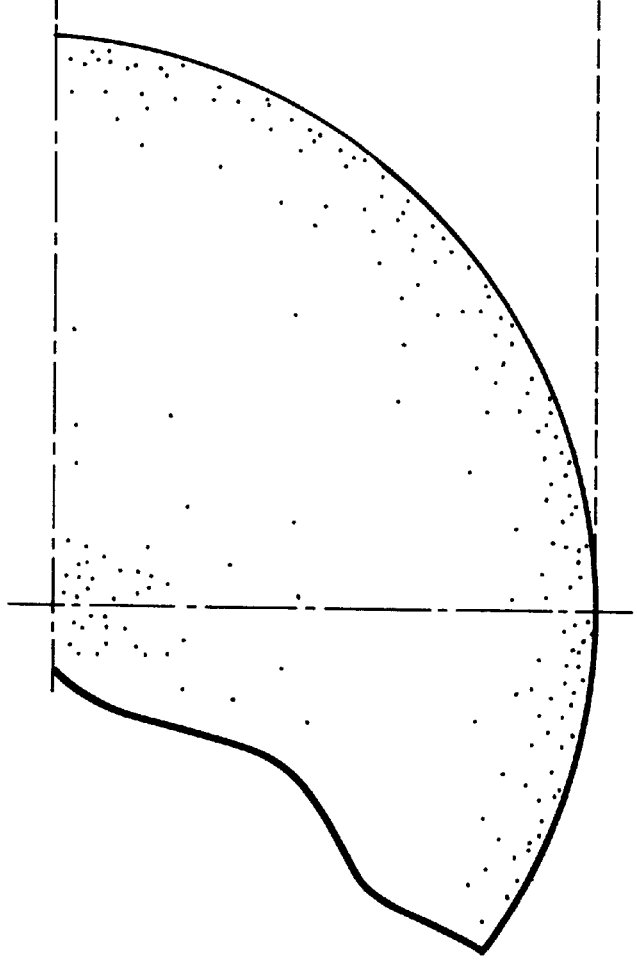
FIG. 16B shows distribution of contaminants present on a washing surface of wafer.
Figure 17A:
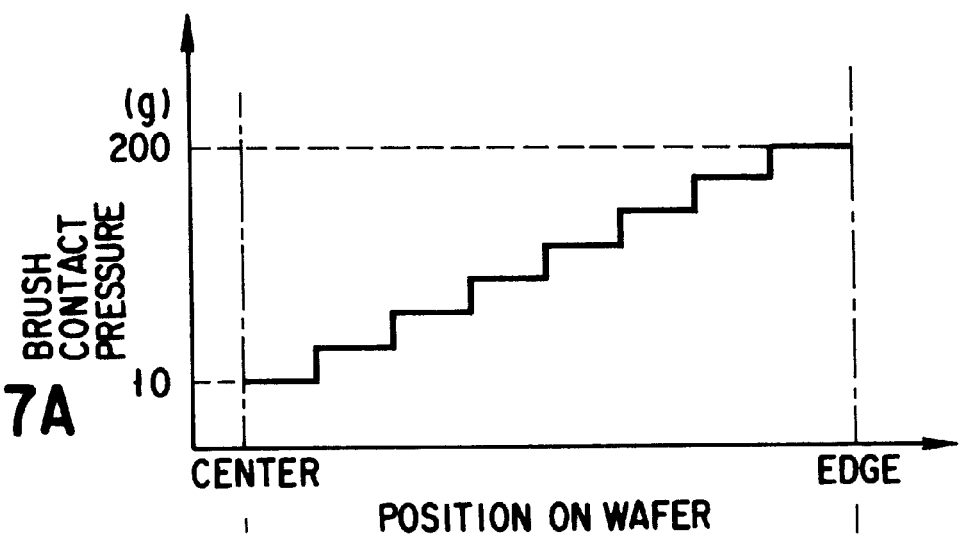
FIG. 17A is a graph showing another example as to how to control the scrubbing operation in the method of the present invention for washing a substrate.
Figure 17B:
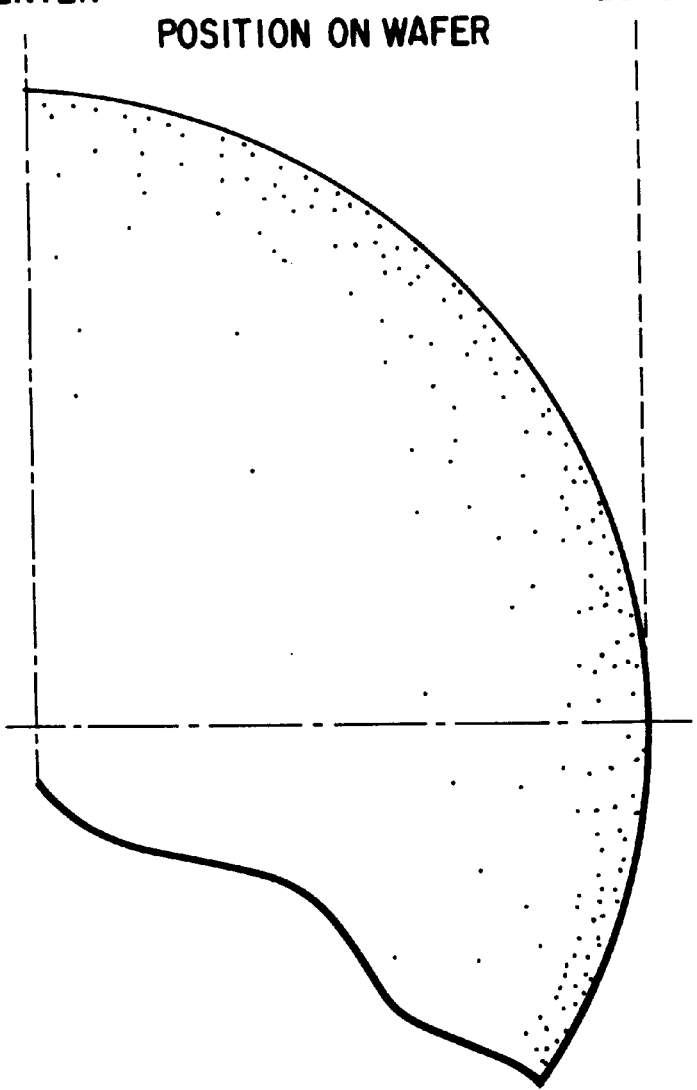
FIG. 17B shows distribution of contaminants present on a washing surface of wafer.
Figure 18A:
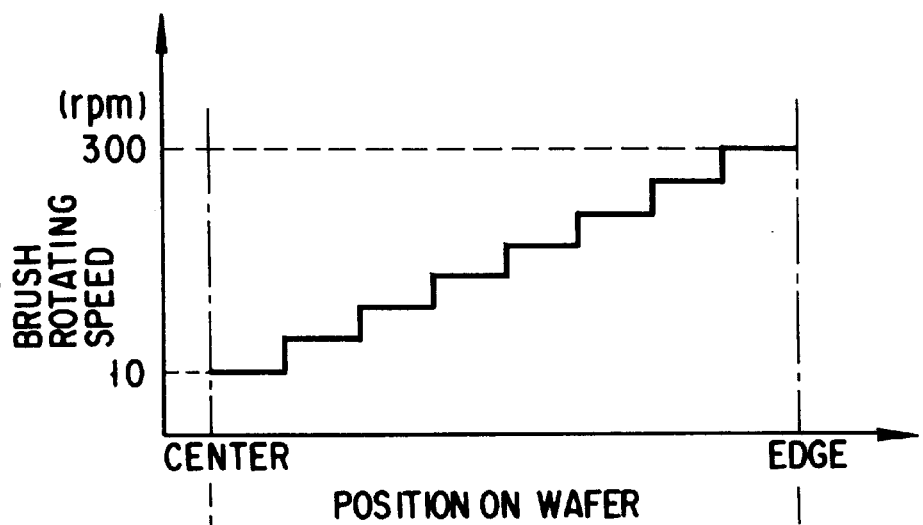
FIG. 18A is a graph showing another example as to how to control the scrubbing operation in the method of the present invention for washing a substrate.
Figure 18B:
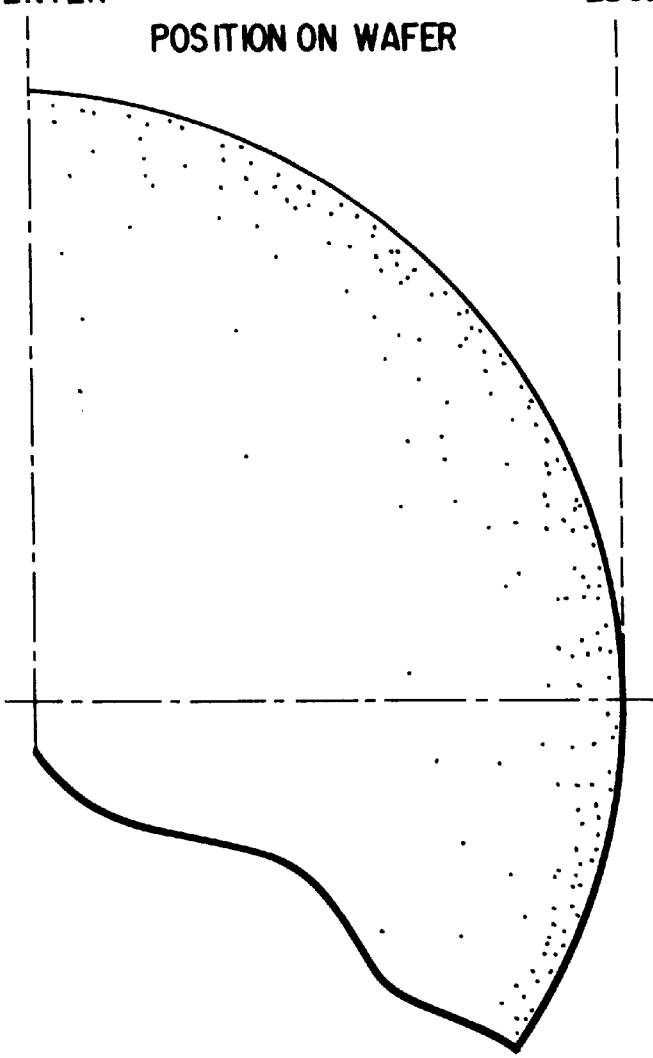
FIG. 18B shows distribution of contaminants present on a washing surface of wafer.

FIGS. 13A to 20B show various modes of the scrubbing operation control step S7.

Where contaminants are distributed mainly in a peripheral portion of the wafer W as shown in FIG. 13B, the control device 80 controls the operation of the brush arm swinging mechanism 22 to permit the brush arm 10a to be moved at a high speed in a central portion of the wafer W and at a low speed in a peripheral portion of the wafer W as shown in FIG. 13A. In this case, the moving speed of the brush arm 10a is changed stepwise ranging between 300 mm/sec in a central portion of the wafer W and 1 mm/sec in the outermost peripheral portion of the wafer W. If the moving speed of the brush arm 10a is controlled in this fashion, the peripheral portion of the wafer W is scrubbed with the brush 10b for a longer time, with the result that the peripheral portion is washed sufficiently so as to remove effectively the contaminants attached to the peripheral portion. In the central portion of the wafer W, however, the scrubbing time of the wafer W with the brush 10b is short, making it possible to prevent the difficulty that the contaminants attached to the brush 10b are transferred onto the wafer surface so as to contaminated the wafer surface.

Where contaminants are distributed mainly in a peripheral portion of the wafer W as shown in FIG. 14B, the control device 80 controls the operation of the brush arm swinging mechanism 22 to permit the brush arm 10a to be moved at a high speed in a central portion of the wafer W and at a low speed in a peripheral portion of the wafer W as shown in FIG. 14A. In this case, the moving speed of the brush arm 10a is changed continuously from 300 mm/sec in a central portion of the wafer W to 1 mm/sec in the outermost peripheral portion of the wafer W.

Where contaminants are distributed mainly in a central portion of the wafer W as shown in FIG. 15B, the control device 80 controls the operation of the brush arm swinging mechanism 22 to permit the brush arm 10a to be moved at a low speed in a central portion of the wafer W and at a high speed in a peripheral portion of the wafer W as shown in FIG. 15A. In this case, the moving speed of the brush arm 10a is changed stepwise ranging between 1 mm/sec in a central portion of the wafer W and 300 mm/sec in the outermost peripheral portion of the wafer W.

Where contaminants are distributed mainly in a central portion and the outermost peripheral portion of the wafer W as shown in FIG. 16B, the control device 80 controls the operation of the brush arm swinging mechanism 22 to permit the brush arm 10a to be moved at a low speed in a central portion and the outermost peripheral portion of the wafer W and at a high speed in a region intermediate between the central portion and the outermost peripheral portion of the wafer W as shown in FIG. 16A. In this case, the moving speed of the brush arm 10a is changed stepwise ranging between 1 mm/sec in the central portion and the outermost peripheral portion of the wafer W and 300 mm/sec in the region intermediate between the central portion and the outermost peripheral portion of the wafer W.

Where contaminants are distributed mainly in a peripheral portion of the wafer W as shown in FIG. 17B, the control device 80 controls the operation of the brush vertical driver 24a to permit the contact pressure of the upper brush 10b to be lower in a central portion of the wafer W and higher in a peripheral portion of the wafer W as shown in FIG. 17A. In this case, the contact pressure of the upper brush 10b against the wafer W is changed stepwise ranging between 10 g in a central portion of the wafer W and 200 g in the outermost peripheral portion of the wafer W.

Where contaminants are distributed mainly in a peripheral portion of the wafer W as shown in FIG. 18B, the control device 80 controls the operation of the brush rotating motor 25 to permit the rotating speed of the upper brush 10b to be lower in a central portion of the wafer W and higher in a peripheral portion of the wafer W as shown in FIG. 18A. In this case, the rotating speed of the upper brush 10b is changed stepwise ranging between 10 rpm in a central portion of the wafer W and 300 rpm in the outermost peripheral portion of the wafer W.

Where contaminants are distributed mainly in a peripheral portion of the wafer W as shown in FIG. 19B, the control device 80 controls the operation of the spin chuck driving motor 19 to permit the rotating speed of the spin chuck 9 to be higher when the upper brush 10b is in contact with the central portion of the wafer W and to be lower when the upper brush 10b is in contact with the peripheral portion of the wafer W. In this case, the rotating speed of the spin chuck 9 is changed stepwise ranging between 5000 rpm when the upper brush 10b is in contact with the central portion of the wafer W and 100 rpm when the upper brush 10b is in contact with the peripheral portion of the wafer W.

Figures 20A, 20B:
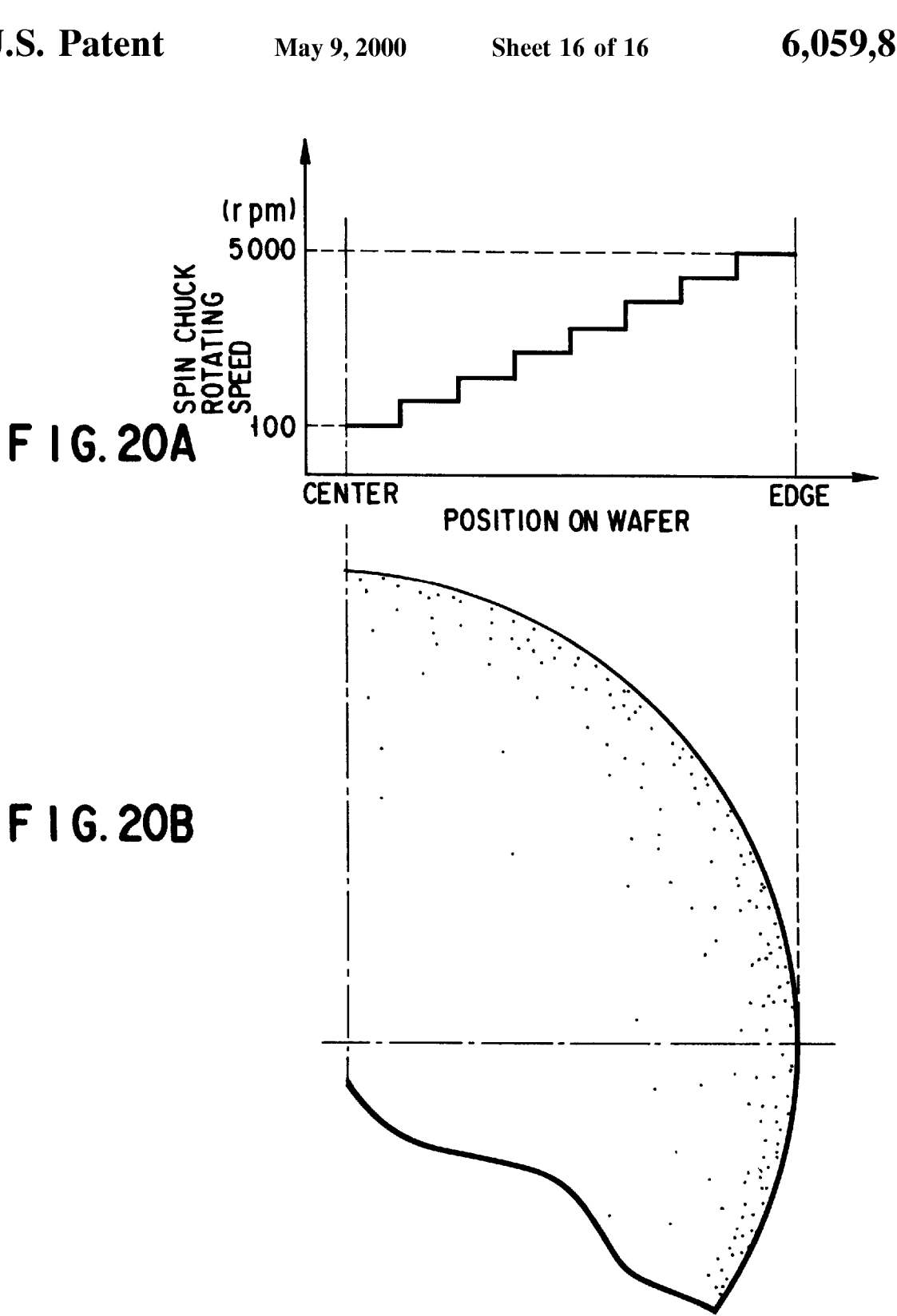
FIG. 20A is a graph showing another example as to how to control the scrubbing operation in the method of the present invention for washing a substrate.
FIG. 20B shows distribution of contaminants present on a washing surface of wafer.

Further, where contaminants are distributed mainly in a peripheral portion of the wafer W as shown in FIG. 20B, the control device 80 controls the operation of the spin chuck driving motor 19 to permit the rotating speed of the spin chuck 9 to be lower when the upper brush 10b is in contact with the central portion of the wafer W and to be higher when the upper brush 10b is in contact with the peripheral portion of the wafer W. In this case, the rotating speed of the spin chuck 9 is changed stepwise ranging between 5000 rpm when the upper brush 10b is in contact with the outermost peripheral portion of the wafer W and 100 rpm when the upper brush 10b is in contact with the central portion of the wafer W.

In the method shown in FIG. 19A, the brush 10b is kept in contact with the outermost peripheral portion of the wafer W for a long time, making it possible to remove effectively the contaminants from the outermost peripheral portion of the wafer W.

The method shown in FIG. 20 is exceptional. In this method, the contact time between the outermost peripheral portion of the wafer W and the brush 10b is short, with the result that the particles generated from the brush 10b are effectively prevented from being reattached again to the outermost peripheral portion of the wafer W.

Further, it is possible to control the moving speed of the brush arm 10a while controlling at least one of the contact pressure of the brush 10b, the rotating speed of the brush 10b and the rotating speed of the spin chuck 9.

In any of the embodiments described above, the nozzle arm 10a and the water jet spurting nozzle 15 are formed as separate members. However, it is also possible to allow the nozzle arm 10a to perform the function of spurting a water jet. In this case, the space for mounting the water jet spurting nozzle 15 can be omitted. Also, the time for the washing treatment can be shortened because a water jet can be spurted immediately after sliding of the brush 10b.

Further, in any of the embodiments described above, a semiconductor wafer is used as an object to be washed. However, the technical idea of the present invention can also be applied to the washing of, for example, a glass substrate for LCD.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An apparatus for washing a substrate, comprising:

a spin chuck for holding and rotating a substrate to be washed;

washing means for supplying a washing liquid onto a surface of the substrate held on the spin chuck and applying a physical force to contaminants present on a surface of the substrate so as to remove said contaminants;

a supporting arm for supporting the washing means;

an arm driving mechanism for driving the supporting arm to move the washing means along the surface from a central portion toward a peripheral portion of the substrate; and control means for controlling the operation of at least one of the washing means, the spin chuck and the arm driving mechanism so as to control the physical force acting on the contaminants present on the surface of the substrate depending on a detected distribution of contaminants on the surface of the substrate.

2. The apparatus according to claim 1, further comprising a sensor for detecting the distribution of contaminants present on the surface of the substrate before the washing treatment, the distribution detected being supplied to said control means to permit the control means to control the operation of at least one of the washing means, the spin chuck and the arm driving mechanism.

3. The apparatus according to claim 1, further comprising:

means for determining the distribution of contaminants present on the surface of the substrate before the washing treatment; and input means for supplying the the distribution determined by the determining means to said control means, as initially set data;

wherein the control means reads out said initially set data so as to control at least one of the washing means, the spin chuck and the arm driving mechanism based on said initially set data.

4. The apparatus according to claim 1, wherein said washing means comprises a rotary driven brush for scrubbing the surface of the substrate and switching means for switching the rotating direction of the brush between the clockwise direction and the counter clockwise direction.

5. The apparatus according to claim 4, further comprising a brush pressing mechanism for pressing said rotary driven brush against the surface of the substrate;

wherein said control means controls said brush pressing mechanism to permit the contact pressure of the rotary driven brush applied to the surface of the substrate to be gradually increased or gradually decreased while said washing means is moved by said arm driving mechanism from a central portion toward a peripheral portion of the substrate.

6. The apparatus according to claim 4, further comprising a variable brush rotation mechanism for gradually increasing or decreasing the rotating speed of the rotary driven brush;

wherein said control means controls said variable brush rotation mechanism to permit the rotating speed of the rotary driven brush to be gradually increased or gradually decreased while said washing means is moved by said arm driving mechanism from a central portion toward a peripheral portion of the substrate.

7. The apparatus according to claim 1, wherein said washing means includes a brush rotatable about a vertical supporting shaft.

8. The apparatus according to claim 1, wherein said washing means includes a brush which is not rotatable about a supporting shaft.

9. The apparatus according to claim 1, wherein said arm driving mechanism includes an arm swinging mechanism for swinging said supporting arm to permit the washing means to be moved along the surface of the substrate in a radial direction of the substrate, and said control means permits said arm swinging mechanism to gradually increase or decrease the moving speed of the washing means while the arm driving mechanism moves the washing means from a central portion toward a peripheral portion of the substrate.

10. The apparatus according to claim 1, further comprising a spin chuck rotation variable mechanism for increasing or decreasing the rotating speed of the spin chuck;

wherein said control means permits said spin chuck rotation variable mechanism to gradually increase or decrease the rotating speed of the spin chuck while said arm driving mechanism moves the washing means from a central portion toward a peripheral portion of the substrate.

11. The apparatus according to claim 1, wherein said washing means includes an ultrasonic wave washing mechanism for applying an ultrasonic wave to the surface of the substrate covered with the washing liquid.

12. The apparatus according to claim 1, wherein said washing means includes a high pressure water jet washing mechanism for spurting a high pressure water against the surface of the substrate.

13. The apparatus according to claim 1, wherein said washing means includes a first brush mechanism for scrub-washing a pattern-forming surface of a substrate and a second brush mechanism for scrub-washing that surface of the substrate on which a pattern is not formed.

14. The apparatus according to claim 1, further comprising a nozzle for supplying a rinsing liquid onto the surface of the substrate.

15. A method of washing a substrate, comprising the steps of:

(a) detecting a distribution of contaminants present on a surface of a substrate to be washed;

(b) holding the substrate by a spin chuck;

(c) aligning washing means mounted to an arm movably supported on an arm driving mechanism relative to the surface of the substrate holded by the spin chuck;

(d) rotating the substrate together with the spin chuck; and (e) washing said substrate by supplying a washing liquid onto the washing surface of the substrate, which is kept rotating, and controlling the operation of at least one of the washing means, the spin chuck and the arm driving mechanism depending on the distribution of contaminants detected in step (a), and applying a physical force to the contaminants present on the surface of the substrate so as to remove the contaminants.

16. The method according to claim 15, wherein the distribution of contaminants present on the surface of the substrate before the washing treatment is detected in said step (a), and at least one of the washing means, the spin chuck and the arm driving mechanism is controlled in said step (e) based on the distribution detected.

17. The method according to claim 15, wherein the distribution of contaminants present on the surface of the substrate before the washing treatment is detected in said step (a) and the detected distribution is stored in the control means as initially set data, and the initially set data is read out in said step (e) so as to control at least one of the washing means, the spin chuck and the arm driving mechanism based on the initially set data.

18. The method according to claim 15, wherein the washing means includes a rotary driven brush for scrubbing the surface of the substrate, and the rotating speed of said rotary driven brush is gradually increased or gradually decreased in said step (e) while the arm driving mechanism moves the washing means from a central portion toward a peripheral portion of the substrate.

19. The method according to claim 18, wherein the contact pressure of the rotary driven brush applied to the substrate is gradually increased or gradually decreased in said step (e) while the arm driving mechanism moves the washing means from a central portion toward a peripheral portion of the substrate.

20. The method according to claim 18, wherein the rotating speed of the rotary driven brush is gradually increased or gradually decreased in said step (e) while the arm driving mechanism moves the washing means from a central portion toward a peripheral portion of the substrate.

21. The method according to claim 15, wherein the rotating speed of the spin chuck is gradually increased or gradually decreased in said step (e) while the arm driving mechanism moves the washing means from a central portion toward a peripheral portion of the substrate.

22. The method according to claim 15, wherein said washing means includes means for applying an ultrasonic wave to the washing surface of the substrate, and the ultrasonic wave applied to the washing surface of the substrate is gradually increased or gradually decreased in said step (e) while the arm driving mechanism moves the washing means from a central portion toward a peripheral portion of the substrate.

23. The method according to claim 15, wherein both surfaces of a substrate are simultaneously washed in said step (e).

24. The method according to claim 17, wherein said initially set data obtained for said substrate is used to control at least one of the washing means, the spin chuck and the arm driving mechanism during washing of substrates subjected to the same manufacturing process as said substrate.

* * * * *